US 8,363,508 B2

(12) United States Patent
Fujisawa

(10) Patent No.: US 8,363,508 B2
(45) Date of Patent: Jan. 29, 2013

(54) SEMICONDUCTOR DEVICE HAVING ODT FUNCTION AND DATA PROCESSING SYSTEM INCLUDING THE SAME

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 231 days.

(21) Appl. No.: 12/805,802

(22) Filed: Aug. 19, 2010

(65) Prior Publication Data

US 2011/0058442 A1   Mar. 10, 2011

(30) Foreign Application Priority Data

Sep. 10, 2009 (JP) ................. 2009-208786

(51) Int. Cl.
*G11C 8/18* (2006.01)
*H03K 19/003* (2006.01)
(52) U.S. Cl. ...................... 365/233.1; 365/236; 365/240; 326/30
(58) Field of Classification Search ............... 365/233.1, 365/236, 240, 194
See application file for complete search history.

(56) References Cited

U.S. PATENT DOCUMENTS

| 6,928,007 | B2 * | 8/2005 | Jin ................................ 365/194 |
| 7,342,412 | B2 * | 3/2008 | Kim ............................... 326/30 |
| 7,688,671 | B2 | 3/2010 | Hosoe et al. |
| 2005/0180229 | A1 * | 8/2005 | Jin ................................ 365/194 |
| 2007/0103188 | A1 | 5/2007 | Hosoe et al. |
| 2008/0159026 | A1 * | 7/2008 | Oh et al. ........................ 365/194 |
| 2009/0016124 | A1 * | 1/2009 | Kim ............................... 365/194 |

FOREIGN PATENT DOCUMENTS

JP       2007-115366 A   5/2007

* cited by examiner

*Primary Examiner* — Hoai V Ho
*Assistant Examiner* — Tri Hoang
(74) *Attorney, Agent, or Firm* — McGinn IP Law Group, PLLC

(57) ABSTRACT

To include an AL counter that outputs a second ODT signal after counting a clock signal by an additive latency after receiving a first ODT signal, and a counter control circuit that controls the AL counter such that the second ODT signal having the same logic value as a logic value of the first ODT signal at a time of shifting from an asynchronous mode to a synchronous mode is output during a period until when at least the clock signal is input by an additive latency after the shifting. With this configuration, an interruption of an CDT operation can be prevented without separately providing a CKE counter. Therefore, the circuit scale can be reduced and the power consumption can be also reduced.

8 Claims, 10 Drawing Sheets

SEMICONDUCTOR DEVICE HAVING ODT FUNCTION AND DATA PROCESSING SYSTEM INCLUDING THE SAME

BACKGROUND OF THE INVENTION

1. Field of the Invention

The present invention relates to a semiconductor device and a data processing system including the same, and more particularly relates to a semiconductor device having an ODT (On Die Termination) function and a data processing system including the semiconductor device.

2. Description of Related Art

In a semiconductor device having plural chips arranged in parallel on an external bus, such as a DRAM (Dynamic Random Access Memory), a signal is occasionally reflected by chips having an output buffer in a high impedance state (Hi-Z). The signal quality on the external bus is degraded when such a reflection of a signal occurs. Therefore, a semiconductor device required to have a high data-transfer rate, such as a DDR2 SDRAM or a DDR3 SDRAM (Synchronous DRAM), often includes an ODT function that causes an output circuit to function as a terminating resistor.

When a semiconductor device has an ODT function, a terminating resistor is not required on a motherboard. Therefore, the number of parts can be reduced and reflections of signals can be prevented more effectively, and consequently the signal quality on the external bus can be improved.

An ODT operation is turned ON/OFF based on an external ODT signal supplied from outside of a semiconductor device. A period of time from when the external ODT signal is activated until when the ODT operation is turned ON is called "ODT latency (ODTL)". While the value of the ODTL is fixed at two clock cycles in a DDR2 SDRAM, the value of the ODTL is defined by AL+CWL−2 in a DDR3 SDRAM. This arrangement is set because when the value of the ODTL is fixed at two clock cycles, a clock frequency improves and a clock cycle becomes short, resulting in a state where ON/OFF of the ODT operation is not quick enough. In this explanation, the "AL" represents an additive latency, and means an advanced input cycle of a column command, and the "CWL" means a clock cycle from an input of a write command to an input of write data.

For example, AL=0tCK, 3tCK to 13tCK, and CWL=5tCK to 10tCK in the DDR3 SDRAM. Therefore, the value of the ODTL is 3tCK to 21tCK, where "tCK" represents a clock cycle. In the DDR3 SDRAM, a latency width of the ODT becomes large and can be a very large value in the above manner. Therefore, a variable latency counter for the ODT needs to be provided inside of the DDR3 SDRAM.

Meanwhile, in the DDR3 SDRAM, the ODTL needs to be set at zero when entering in a slow power-down mode. When having entered in the slow power-down mode, an operation of a DLL circuit stops because of its reduced power consumption, and its latency cannot be correctly counted. Therefore, in a normal mode in which a DLL circuit is operating, an ODT operation is performed in a synchronous mode in which the ODTL is defined by AL+CWL−2. In the slow power-down mode in which the DLL circuit is stopped, an ODT operation is performed in an asynchronous mode. When returning from the slow power-down mode to the normal mode, an accurate ODT operation in the synchronous mode becomes possible after a lapse of a constant period to stabilize the operation of the DLL circuit. The constant period to stabilize the operation of the DLL circuit is called "tXPDLL", and it is defined as 24 ns in DDR3 SDRAMs.

What is problematic is a case of shifting from a slow power-down mode to a normal mode while an external ODT signal is activated. In this case, because an ODT operation is switched from the asynchronous mode to the synchronous mode in the middle, the ODT becomes temporarily OFF depending on a circuit configuration although an ODT ON state should be maintained. Such cases occur when an ODT signal path for the synchronous mode and an ODT signal path for the asynchronous mode are provided and when an output from these signal paths is selected according to a mode, for example. For an internal ODT signal to pass through the ODT signal path for the synchronous mode, the lapse of the ODTL described above is necessary. Therefore, when a selection of an output is immediately switched from the ODT signal path for the asynchronous mode to the ODT signal path for the synchronous mode, the ODT operation is stopped in the middle thereof.

As a method of solving the above problems, there is a method described in Japanese Patent Application Laid-open No. 2007-115366. According to this proposed method, not only a counter that counts a latency of an ODT signal, but also a counter that counts a latency of a clock enable signal (an external signal designating an entry to and an exit from the slow power-down mode) is provided. When an asynchronous mode is shifted to a synchronous mode, a path is not immediately switched from an ODT signal path for the asynchronous mode to an ODT signal path for the synchronous mode, but the path is changed after waiting for an output of a counter that counts a latency of a clock enable signal. According to this method, even when the asynchronous mode is shifted to the synchronous mode, the ODT signal path for the synchronous mode becomes effective after an ODTL passes, and thus this method can prevent the ODT operation from being stopped in the middle thereof.

However, according to the above method, a counter that counts a latency of the clock enable signal is necessary in addition to the counter that counts a latency of the ODT signal. Therefore, the circuit scale becomes larger and the power consumption also becomes larger.

The above problems occur not only in DDR3 SDRAMs but also in common in semiconductor devices having a synchronous mode of activating an ODT synchronously with a clock signal and an asynchronous mode of activating an ODT asynchronously with a clock signal.

SUMMARY OF THE INVENTION

In one embodiment, there is provided semiconductor device having a synchronous mode of activating an ODT synchronously with a second clock signal generated based on a first clock signal and an asynchronous mode of activating an ODT asynchronously with the second clock signal, that includes: a first FIFO counter that outputs a second internal ODT signal after counting the first clock signal by a first predetermined number after receiving a first internal ODT signal; and a counter control circuit that controls the FIFO counter such that the second internal ODT signal having a same logic value as a logic value of the first internal ODT signal at a time of shifting from the asynchronous mode to the synchronous mode is output during a period until when at least the first clock signal is input by the first predetermined number after the shifting.

According to the present invention, when the asynchronous mode shifts to the synchronous mode, the second internal ODT signal having the same logic value as that of the first internal ODT signal at a shifting time is output during a constant period of time. Therefore, an interruption of the ODT operation can be prevented without separately providing a counter that counts a latency of a clock enable signal. Consequently, the circuit scale is reduced, the chip area can be reduced, and the power consumption can be also reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
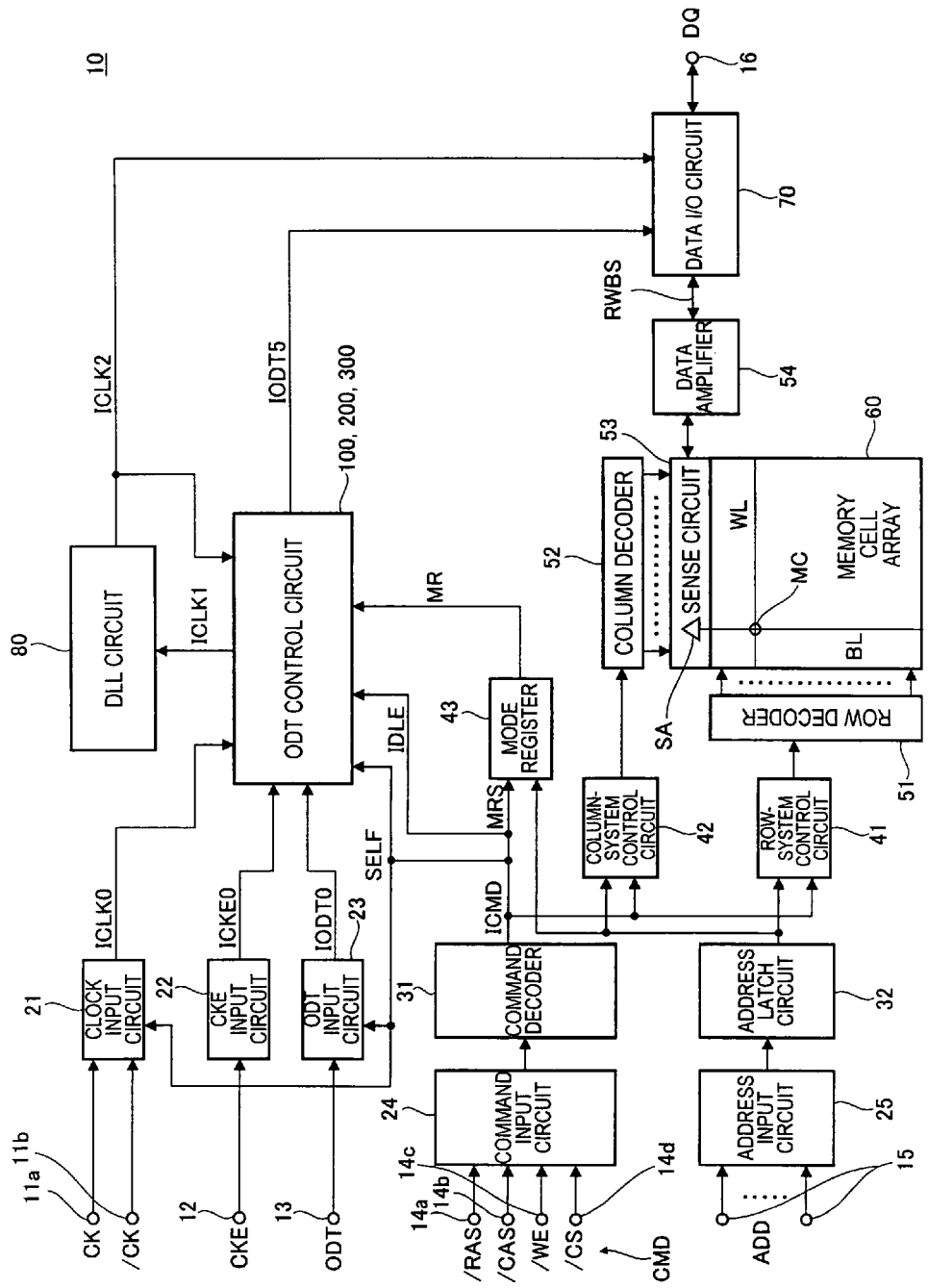
FIG. 1 is a block diagram showing a configuration of a semiconductor device 10 according to an embodiment of the present invention.

FIG. 1 is a block diagram showing a configuration of a semiconductor device (SDRAM) 10 according to an embodiment of the present invention.

The semiconductor device 10 according to the present embodiment is a DDR3 SDRAM, and as external terminals, includes clock terminals 11a and 11b, a clock enable terminal 12, an ODT terminal 13, command terminals 14a to 14d, an address terminal 15, and a data input/output (I/O) terminal 16. Although the semiconductor device 10 also includes a data strobe terminal, a power source terminal or the like, these terminals are not shown in FIG. 1.

The clock terminals 11a and 11b are supplied with external clock signals CK and /CK, respectively. The supplied external clock signals CK and /CK are supplied to a clock input circuit 21. In the present specification, a signal having "/" at the head of a signal name means an inversion signal of a corresponding signal or a low active signal. Therefore, the external clock signals CK and /CK are mutually complementary signals. The clock input circuit 21 generates an internal clock signal ICLK0 of a single phase by receiving the external clock signals CK and /CK. The internal clock signal ICLK0 is supplied to an ODT control circuit 100 (200, 300) described later, and is also supplied to various internal circuits and is used for an operation clock signal. A circuit configuration of the ODT control circuit 100 (200, 300) is described later.

The clock enable terminal 12 is supplied with an external-clock enable signal CKE, and the supplied external-clock enable signal CKE is supplied to a CKE input circuit 22. The CKE input circuit 22 receives the external-clock enable signal CKE, and generates an internal-clock enable signal ICKE0 based on this. The internal-clock enable signal ICKE0 is supplied to at least the ODT control circuit 100 (200, 300).

The ODT terminal 13 is supplied with an external ODT signal ODT, and the supplied external ODT signal ODT is supplied to an ODT input circuit 23. The external ODT signal ODT causes a data I/O circuit 70 to function as a terminating resistor. The ODT input circuit 23 receives the external ODT signal ODT, and generates an internal ODT signal IODT0 based on this. The internal ODT signal IODT0 is supplied to at least the ODT control circuit 100 (200, 300).

The command terminals 14a to 14d are supplied with a row-address strobe signal /RAS, a column-address strobe signal /CAS, a write enable signal /WE, and a chip select signal /CS, respectively. These signals as command signals CMD are supplied to a command input circuit 24. The command signals CMD supplied to the command input circuit 24 are supplied to a command decoder 31. The command decoder 31 holds, decodes, and counts command signals, thereby generating various internal commands ICMD. The generated internal commands ICMD are supplied to a row-system control circuit 41, a column-system control circuit 42, and a mode register 43. Out of the internal commands ICMD, a mode register-set command MRS is supplied to the mode register 43, and a self refresh signal SELF and an idle signal IDLE are supplied to the ODT control circuit 100 (200, 300). The self refresh signal SELF is also supplied to the input circuits 21 and 23. When the self refresh signal SELF is activated, operations of the input circuits 21 and 23 are stopped.

The address terminal 15 is supplied with an address signal ADD. The address signal ADD supplied to this terminal is next supplied to an address input circuit 25. An output of the address input circuit 25 is supplied to an address latch circuit 32. Out of the address signal ADD latched by the address latch circuit 32, a row address is supplied to the row-system control circuit 41, and a column address is supplied to the column-system control circuit 42. When entered in a mode register set, the address signal ADD is supplied to the mode register 43, thereby updating the content of the mode register 43.

An output of the row-system control circuit 41 is supplied to a row decoder 51. The row decoder 51 is a circuit that selects any one word line WL included in a memory cell array 60. In the memory cell array 60, plural word lines WL are intersected with plural bit lines BL, and memory cells MC are arranged at their intersections (FIG. 1 shows only one word line WL, one bit line BL, and one memory cell MC). The bit lines BL are connected to corresponding sense amplifiers SA in a sense circuit 53.

An output of the column-system control circuit 42 is supplied to a column decoder 52. The column decoder 52 selects any one sense amplifier SA included in the sense circuit 53. A sense amplifier SA selected by the column decoder 52 is connected to a data amplifier 54. In a read operation, the data amplifier 54 amplifies read data once amplified by the sense amplifier SA, and supplies the amplified read data to the data I/O circuit 70 via a read/write bus RWBS. On the other hand, in a write operation, the data amplifier 54 amplifies write data supplied from the data I/O circuit 70 via the read/write bus RWBS, and supplies the amplified write data to the sense amplifier SA.

The data I/O terminal 16 is connected to the data I/O circuit 70, and outputs read data DQ and inputs write data DQ. The data I/O circuit 70 is supplied with an internal clock signal ICLK2. In a read operation, the data I/O circuit 70 outputs read data synchronously with the internal clock signal ICLK2. The internal clock signal ICLK2 is a phase-controlled clock signal generated by a DLL circuit 80. The DLL circuit 80 receives an internal clock signal ICLK1 supplied by the ODT control circuit 100 (200, 300), and generates the internal clock signal ICLK2 phase-controlled to the external clock signals CK and /CK by using the internal clock signal ICLK1.

Furthermore, the data I/O circuit 70 is also supplied with an internal ODT signal IODT5, and functions as a terminating resistor at an ODT operation time. The ODT operation is turned ON/OFF synchronously with the internal clock signal ICLK2 when the DLL circuit 80 is operating. That is, the ODT operation is performed in the synchronous mode. On the other hand, when the DLL circuit 80 is not operating, the ODT operation is performed asynchronously with the internal clock signal ICLK2. That is, the ODT operation is performed in the asynchronous mode. The DLL circuit 80 stops operating when the external-clock enable signal CKE is at an inactive level (a low level) or when the self refresh signal SELF or the idle signal IDLE is activated.

When the external-clock enable signal CKE becomes at an inactive level (a low level), an SDRAM 10 enters a power down mode. The power down mode includes a fast power-down mode and the slow power-down mode. Which one of these power down modes to enter is determined in advance by a set value to the mode register 43. The fast power-down mode is a mode of keeping the DLL circuit 80 operating during a power down period, and an operation can be quickly returned to a normal operation. On the other hand, the slow power-down mode is a mode of stopping the DLL circuit 80 during power down. In this mode, the power consumption can be reduced, but it takes time to return to a normal operation. In the slow power-down mode, the DLL circuit 80 stops. Therefore, the ODT operation at a power down time becomes asynchronous. When the power down mode is referred to in the following explanations, it means the slow power-down mode.

Figure 2:
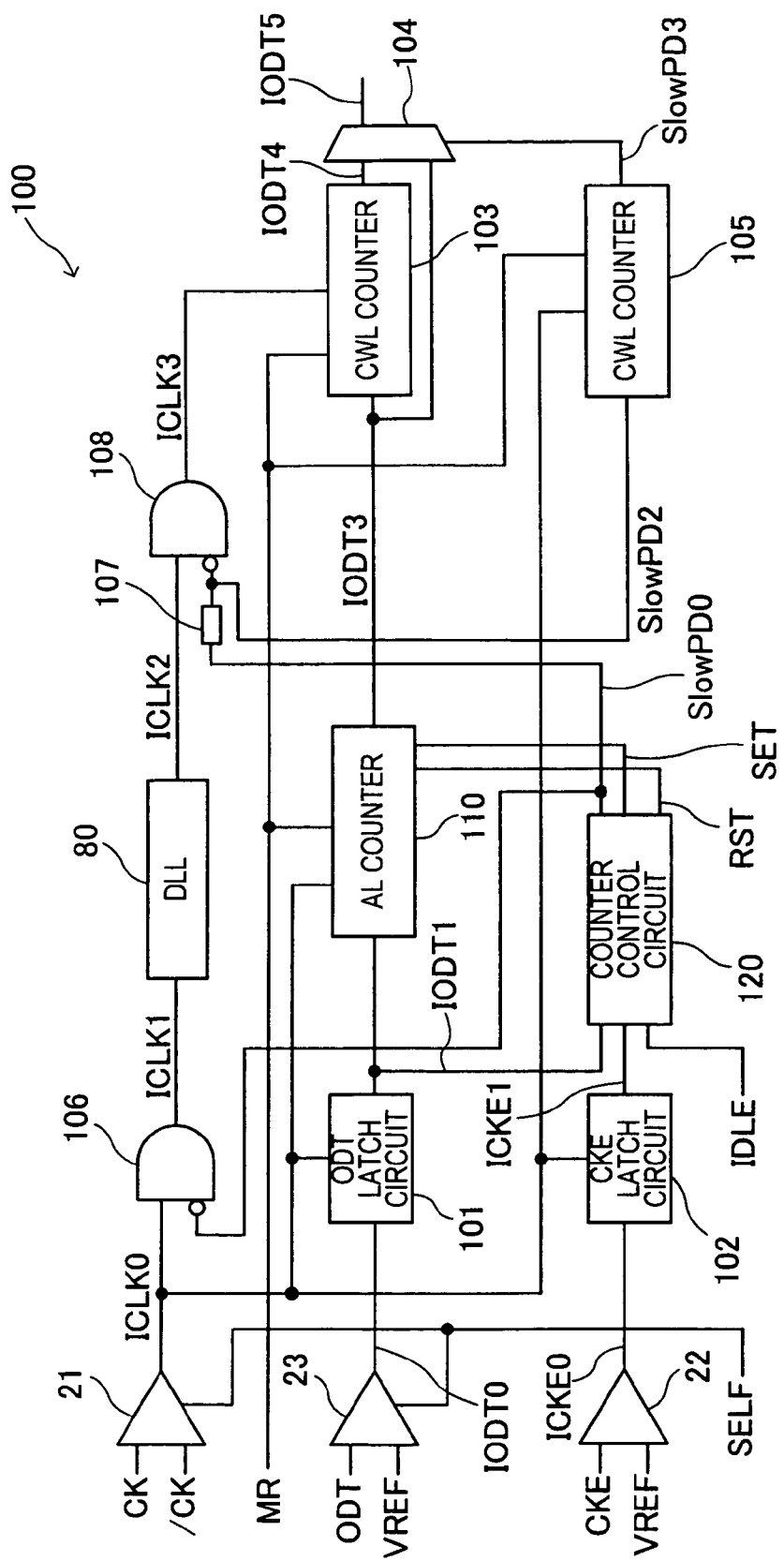
FIG. 2 is a circuit diagram of the ODT control circuit 100 according to a first embodiment.

FIG. 2 is a circuit diagram of the ODT control circuit 100 according to a first embodiment of the present invention.

As shown in FIG. 2, the ODT control circuit 100 includes an ODT latch circuit 101 that latches the internal ODT signal IODT0, and a CKE latch circuit 102 that latches the internal-clock enable signal ICKE0. The latch circuits 101 and 102 perform a latch operation synchronously with the internal clock signal ICLK0. Therefore, an internal ODT signal IODT1 and an internal-clock enable signal ICKE1 as outputs of the latch circuits 101 and 102 respectively become signals synchronous with the internal clock signal ICLK0.

Further, the ODT control circuit 100 further includes an AL counter 110 that receives the internal ODT signal IODT1 output from the latch circuit 101, counts the internal clock signal ICLK0 by an additive latency, and outputs an internal ODT signal IODT3. The AL counter 110 is what is called a FIFO counter, and sequentially outputs the internal ODT signal IODT1 sequentially input, as the internal ODT signal IODT3, by a first-in-first-out method. The AL counter 110 is supplied with a mode signal MR as an output of the mode register 43, and accordingly can change a count number of the internal clock signal ICLK0, that is, an additive latency. A circuit configuration of the AL counter 110 is described later.

The internal ODT signal IODT3 as an output of the AL counter 110 is supplied to a CWL counter 103. The CWL counter 103 is a circuit that receives the internal ODT signal IODT3, counts an internal clock signal ICLK3 by a CAS write latency-two clock cycles, and outputs a result as an internal ODT signal IODT4. The CWL counter 103 is also a FIFO counter, and sequentially outputs the internal ODT signal IODT3 sequentially input, as the internal ODT signal IODT4, by the first-in-first-out method. The CWL counter 103 is also supplied with the mode signal MR, and accordingly can change a count number of the internal clock signal ICLK3, that is, a CAS write latency.

The internal ODT signal IODT4 passing through the CWL counter 103, and the internal ODT signal IODT3 not passing through the CWL counter 103 are input to a multiplexer 104. The multiplexer 104 is a circuit that selects one of the internal ODT signals IODT3 and IODT4 and outputs a result as the internal ODT signal IODT5. This selection is performed by a power down signal SlowPD3 as an output of a CWL counter 105.

The internal ODT signal IODT1 and the internal-clock enable signal ICKE1 as outputs of the latch circuits 101 and 102 are respectively supplied to a counter control circuit 120. The counter control circuit 120 receives the internal ODT signal IODT1, the internal-clock enable signal ICKE1, and the idle signal IDLE, and generates a power down signal SlowPD0, a set signal SET, and a reset signal RST, based on the signals received. A circuit configuration of the counter control circuit 120 is described later.

The power down signal SlowPD0 becomes at a low level in the normal mode, and becomes at a high level in the power down mode (accurately, the slow power-down mode). As shown in FIG. 2, an inversion signal of the power down signal SlowPD0 and the internal clock signal ICLK0 are input to an AND gate 106, and their output is used as the internal clock signal ICLK1. The internal clock signal ICLK1 is an input clock to the DLL circuit 80. Therefore, when the power down signal SlowPD0 is activated at a high level, the operation of the DLL circuit 80 stops.

The power down signal SlowPD0 is delayed by a delay circuit 107, and the power down signal SlowPD0 delayed is used as a power down signal SlowPD2. A delay amount of the delay circuit 107 is set at tXPDLL−CWL−2. This tXPDLL is a period after the DLL circuit 80 starts an operation again until when the internal clock signal ICLK2 is stabilized. As explained above, the tXPDLL is defined as 24 ns in the DDR3 SDRAM. As shown in FIG. 2, an inversion signal of the power down signal SlowPD2 and the internal clock signal ICLK2 are input to an AND circuit 108, and their output is used as the internal clock signal ICLK3. The internal clock signal ICLK3 is an input clock to the CWL counter 103. Therefore, when the power down signal SlowPD2 is activated at a high level, an operation of a CWL counter 130 stops.

The power down signal SlowPD2 is also input to the CWL counter 105. The CWL counter 105 is also a FIFO counter. The CWL counter 105 delays the power down signal SlowPD2 by a CAS write latency-two clock cycles, and outputs a result as the power down signal SlowPD3. The CWL counter 105 is also supplied with the mode signal MR, and accordingly can change a count number of the internal clock signal ICLK0, that is, a CAS write latency.

As described above, the power down signal SlowPD3 is used as a selection signal to the multiplexer 104. Specifically, when the power down signal SlowPD3 is at a low level, that is, in the normal mode, the internal ODT signal IODT4 passing through the CWL counter 103 is selected. On the other hand, when the power down signal SlowPD3 is at a high level, that is, in a power down mode, the internal ODT signal IODT3 not passing through the CWL counter 103 is selected.

Figure 3:
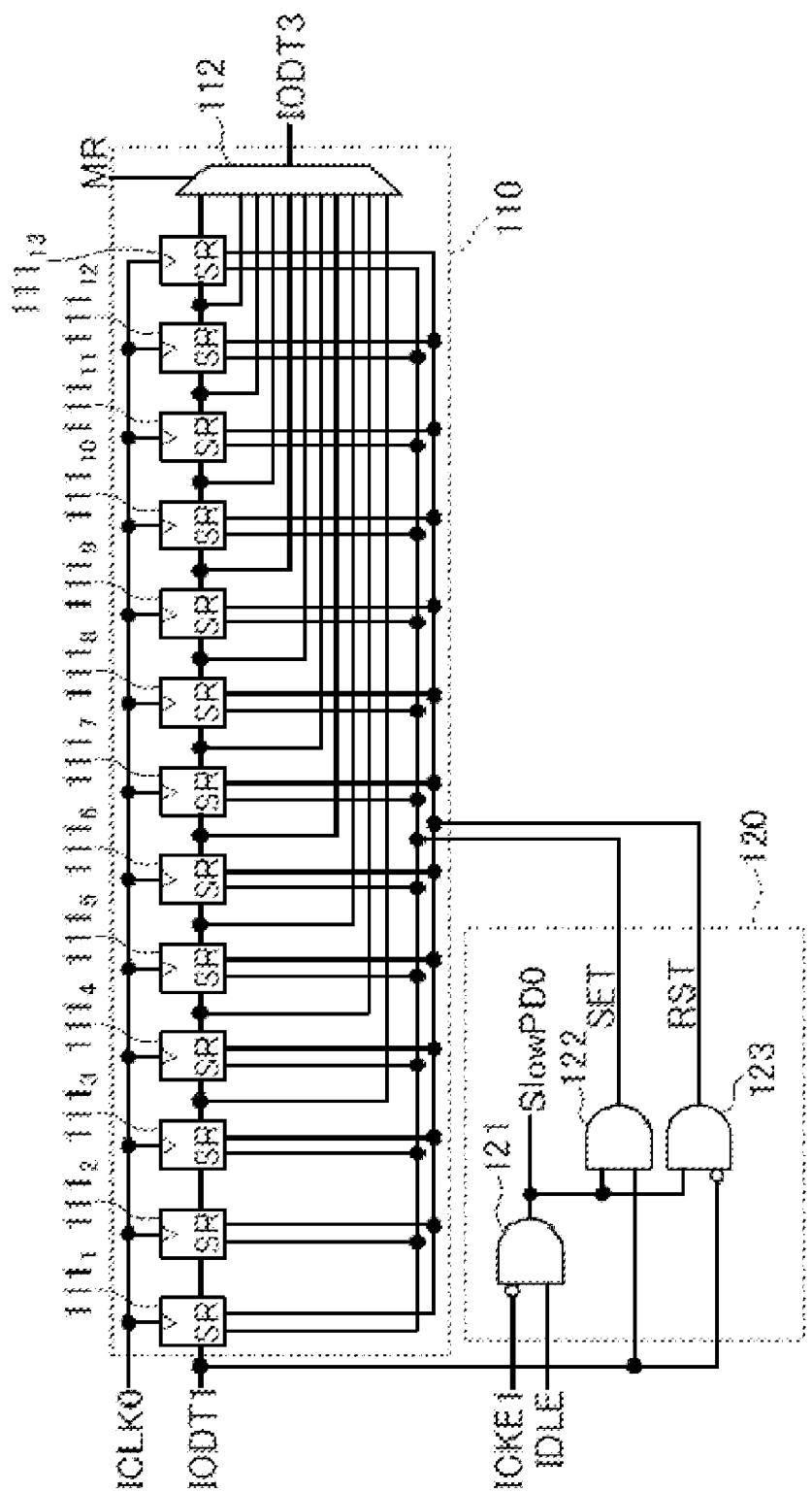
FIG. 3 is a circuit diagram of the AL counter 110 and the counter control circuit 120.

FIG. 3 is a circuit diagram of the AL counter 110 and the counter control circuit 120.

As shown in FIG. 3, the AL counter 110 includes plural register circuits $111_1$ to $111_{13}$ connected in cascade and a multiplexer 112 that extracts any one of outputs of the register circuits $111_1$ to $111_{13}$ as the internal ODT signal IODT3. The internal ODT signal IODT1 is input to the register circuit $111_1$ at an initial stage. The internal clock signal ICLK0 is input in common to clock input ends of the register circuits $111_1$ to $111_{13}$. Accordingly, the register circuits $111_1$ to $111_{13}$ function as a shift register that performs a shift operation synchronously with the internal clock signal ICLK0.

The register circuits $111_1$ to $111_{13}$ are provided with a set input end S and a reset input end R. The set signal SET supplied by the counter control circuit 120 is supplied to the set input end S. When the set signal SET is activated, all the register circuits $111_1$ to $111_{13}$ are set. That is, all outputs become at a high level. The reset signal RST supplied by the counter control circuit 120 is supplied to the reset input end R. When the reset signal RST is activated, all the register circuits $111_1$ to $111_{13}$ are reset. That is, all outputs become at a low level.

Outputs of the register circuits $111_3$ to $111_{13}$ are supplied to the multiplexer 112. One of the outputs is selected based on the mode signal MR. As described above, the mode signal MR supplied to the AL counter 110 shows a value of an active latency.

On the other hand, the counter control circuit 120 includes AND gates 121 to 123. The counter control circuit 120 receives the internal ODT signal IODT1, the internal clock signal ICLK1, and the idle signal IDLE, and generates the power down signal SlowPD0, the set signal SET, and the reset signal RST. The power down signal SlowPD0 is generated by the AND gate 121. As is clear from a circuit configuration shown in FIG. 2, when the internal clock signal ICLK1 is at a low level (an inactive level) and also when the idle signal IDLE is at a high level (an active level), the power down signal SlowPD0 is activated at a high level. In other cases, the power down signal SlowPD0 is inactivated at a low level.

When the power down signal SlowPD0 is activated at a high level, the set signal SET or the reset signal RST is activated according to a logic level of the internal ODT signal IODT1. Specifically, when the power down signal SlowPD0 is activated at a high level, the set signal SET is activated by the AND gate 122 when the internal ODT signal IODT1 is at a high level, and the reset signal RST is activated by the AND gate 123 when the internal ODT signal IODT1 is at a low level. Accordingly, at a power down time, all the register circuits $111_1$ to $111_{13}$ included in the AL counter 110 are set or reset according to a logic level of the internal ODT signal IODT1.

The circuit configuration of the ODT control circuit 100 according to the first embodiment is as described above. An operation of the ODT control circuit 100 is explained next.

Figure 4:
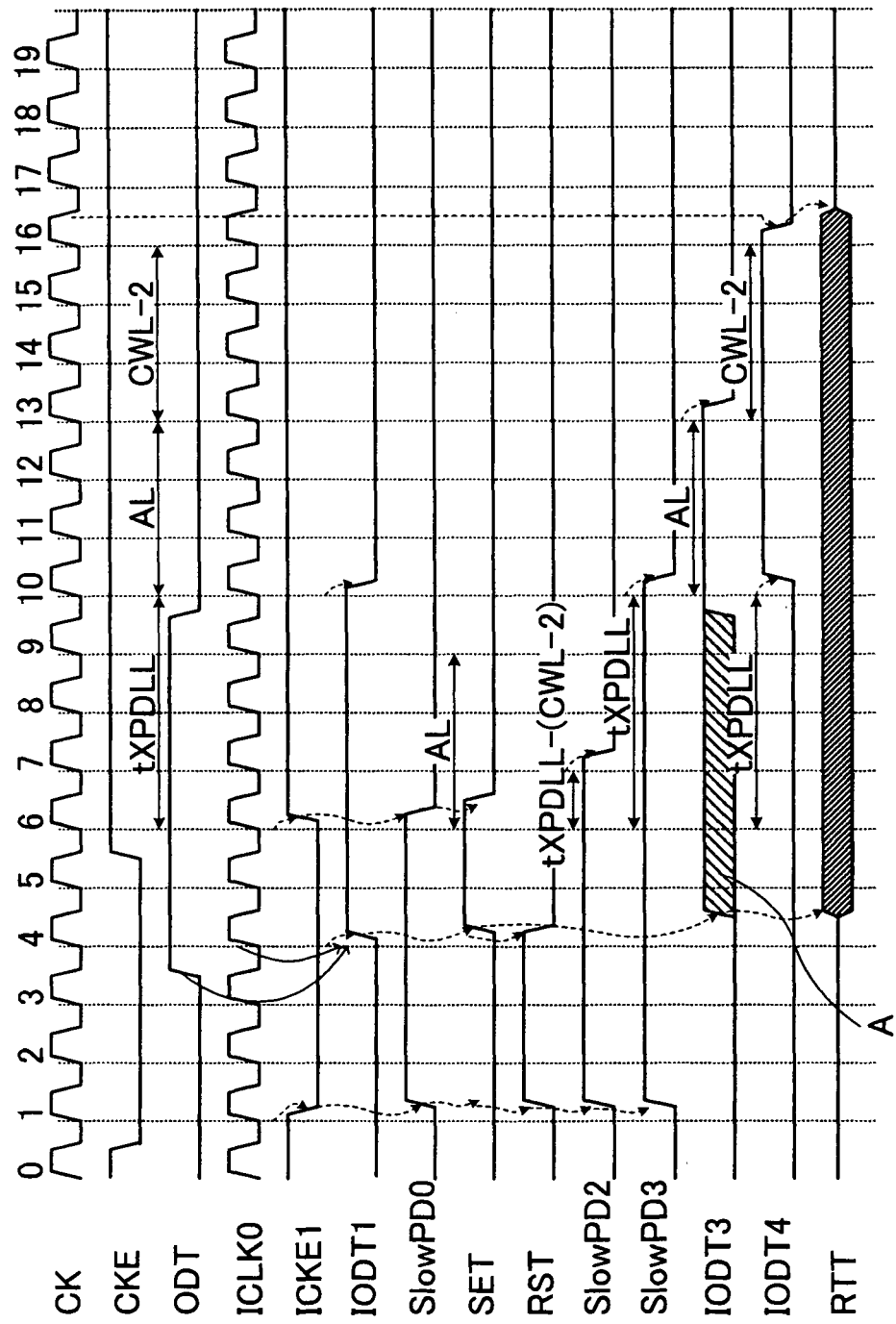
FIG. 4 is a timing diagram for explaining an operation of the ODT control circuit 100 according to the first embodiment.

FIG. 4 is a timing diagram for explaining an operation of the ODT control circuit 100 according to the first embodiment. FIG. 4 is an example when AL=3 and CWL=5.

In the example shown in FIG. 4, the external-clock enable signal CKE is at a low level during a period from an active edge #1 to #5 of the external clock signal CK, and the external-clock enable signal CKE is at a high level during a period from an active edge #6 afterward. The external ODT signal ODT is at a high level during a period from an active edge #4 to #9, and the external ODT signal ODT is at a low level during other period. That is, the external-clock enable signal CKE changes from a low level to a high level at the active edge #6 where the external ODT signal ODT is at a high level.

That is, FIG. 4 shows a state that the ODT operation shifts from the asynchronous mode to the synchronous mode at a timing of the active edge #6.

Specifically, the internal-clock enable signal ICKE1 also changes to a high level in response to the active edge #6, and an operation mode becomes the synchronous mode when the power down signal SlowPD0 changes to a low level. On the other hand, because the internal ODT signal IODT1 changes to a high level at the active edge #4, the internal ODT signal IODT3 at a high level should be output from the AL counter 110 after three clock cycles as a value of the AL, that is, synchronously with the active edge #7, when in the synchronous mode. However, a mode before the active edge #6 is the asynchronous mode, and the content of the AL counter 110 in this period is not usually guaranteed. Therefore, there is a risk that the ODT operation stops.

Regarding this point, in the first embodiment, values of the AL counter 110 are all set or reset according to a logic level of the internal ODT signal IODT1 during a period when the power down signal SlowPD0 is at a high level. Therefore, the logic level of the internal ODT signal IODT1 immediately matches a logic level of the internal ODT signal IODT3 without waiting for a count operation of an additive latency by the AL counter 110. In the timing diagram shown in FIG. 4, in a period A when a hatching is performed, a logic level of the internal ODT signal IODT3 is not usually guaranteed. However, in this example, the period A is fixed at a high level, and therefore, the ODT operation does not stop. The period A is a period after the internal ODT signal IODT1 changes (shifts to a high level in this example), the power down signal SlowPD0 changes to a low level, until when an additive latency passes.

Thereafter, when the external ODT signal ODT changes to a low level at an active edge #10, an additive latency is counted by the AL counter 110. When a CAS write latency is counted by the CWL counter 103, the internal ODT signal IODT4 changes to a low level, and the ODT becomes OFF.

As explained above, according to the first embodiment, values of the AL counter 110 in the power down mode are all set or all reset based on the internal ODT signal IODT. Therefore, the ODT operation does not stop when the asynchronous mode is shifted to the synchronous mode. Because it is not necessary to provide a counter that counts a latency of a clock enable signal like the method in Japanese Patent Application Laid-open No. 2007-115366, the circuit scale can be reduced and the power consumption can be reduced.

In the power down mode, values of the AL counter 110 are all set or all reset in the power down mode. Therefore, the same effect as that when the AL counter 110 is bypassed can be obtained without providing a bypass path and a multiplexer. Accordingly, an operation margin does not decrease due to the presence of a multiplexer.

In the first embodiment, all the register circuits $111_1$ to $111_{13}$ that constitute a shift register in the AL counter 110 are set or reset based on the set signal SET or the reset signal RST. However, all the register circuits $111_1$ to $111_{13}$ are not necessarily required to be set or reset, and it is sufficient to set or reset at least a register circuit of an additive latency including the register circuit $111_1$ at the initial stage. For example, when AL=3, it is sufficient to set or reset the register circuits $111_1$ to $111_3$. This is because circuits exceeding an additive latency number (the register circuits $111_4$ to $111_{13}$ when AL=3) are not actually used.

The ODT control circuit 200 according to a second embodiment of the present invention is explained next.

Figure 5:
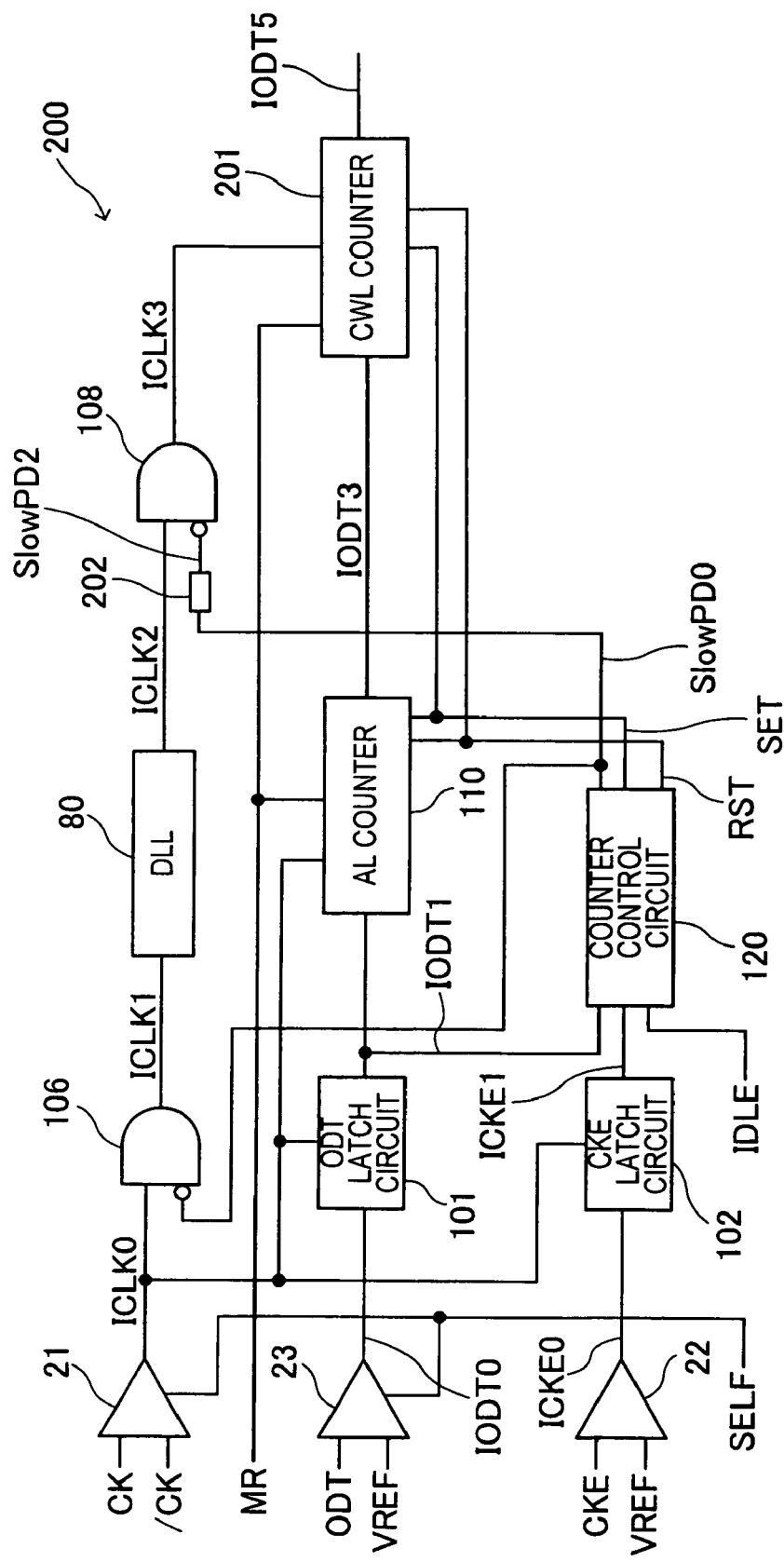
FIG. 5 is a circuit diagram of the ODT control circuit 200 according to the second embodiment.

FIG. 5 is a circuit diagram of the ODT control circuit 200 according to the second embodiment. The ODT control circuit 200 according to the second embodiment can be used instead of the ODT control circuit 100 shown in FIG. 2.

As shown in FIG. 5, the ODT control circuit 200 does not include the CWL counters 103 and 105 and the multiplexer 104 included in the ODT control circuit 100, and includes a CWL counter 201 instead. Further, the ODT control circuit 200 includes a delay circuit 202 of which a delay amount is tXPDLL, instead of the delay circuit 107. The ODT control circuit 200 is the same as the ODT control circuit 100 in other features. Therefore, like reference numerals are denoted to like constituent elements and redundant explanations thereof will be omitted.

The CWL counter 201 has a function same as that of the CWL counter 103, and has a function of setting all contents of the CWL counter 201 in response to the set signal SET and resetting all contents in response to the reset signal RST. That is, the CWL counter 201 operates in a similar manner to that of the AL counter 110.

Figure 6:
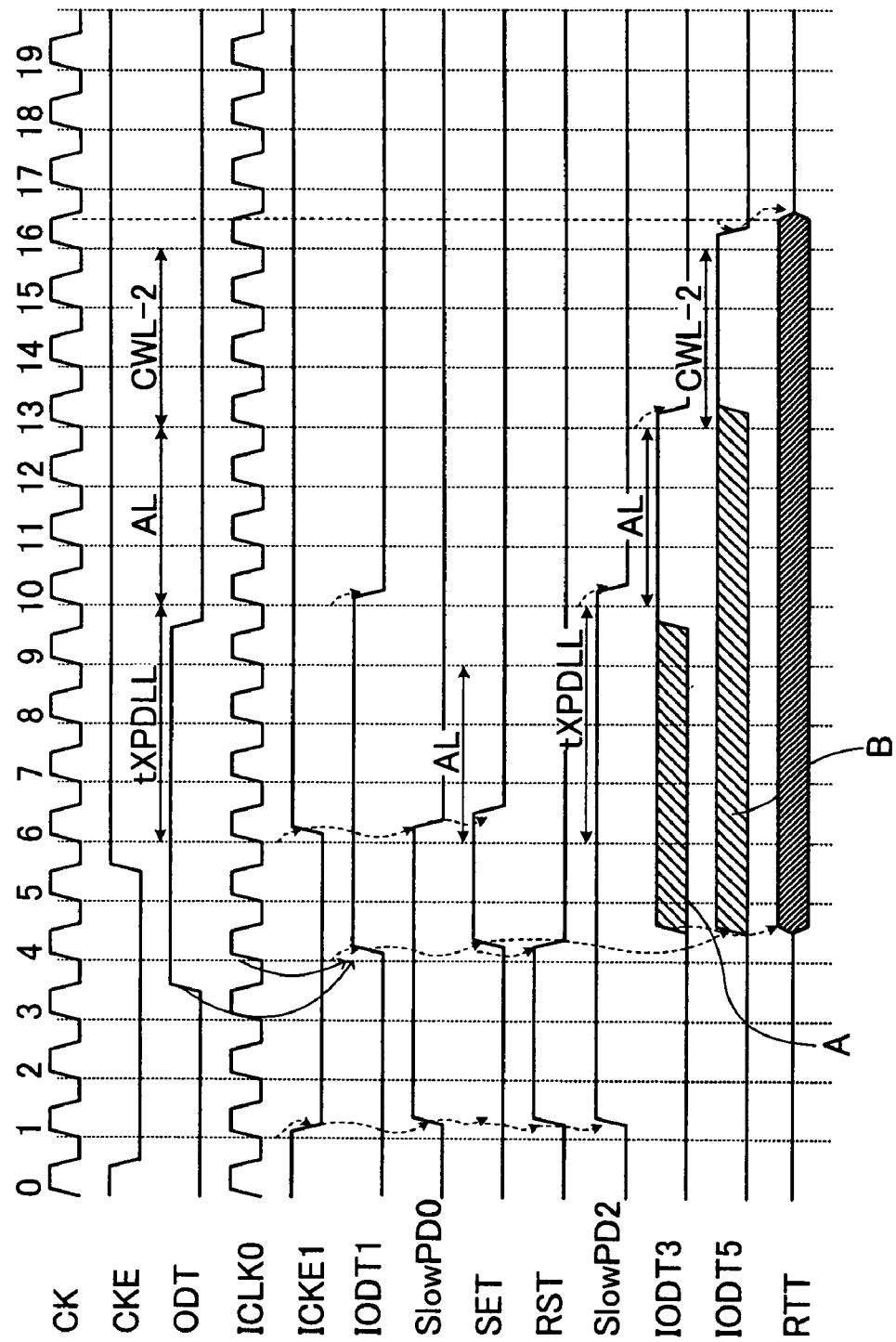
FIG. 6 is a timing diagram for explaining an operation of the ODT control circuit 200 according to the second embodiment.

FIG. 6 is a timing diagram for explaining an operation of the ODT control circuit 200 according to the second embodiment. FIG. 6 also shows an example when AL=3 and CWL=5, and the same external signal as that shown in FIG. 4 is input.

As shown in FIG. 6, in the second embodiment, when the external ODT signal ODT is activated at a high level at the active edge #4, all shift registers in the AL counter 110 and in the CWL counter 201 are set in response to this activation. Therefore, the internal ODT signals IODT3 and IODT5 immediately become at a high level. The internal ODT signal IODT3 is guaranteed at a high level in the period A as already explained above.

On the other hand, the internal ODT signal IODT5 immediately becomes at a high level when all shift registers in the CWL counter 201 are set. This state is guaranteed in a period B. The period B is a period after the internal ODT signal IODT1 changes (shifts to a high level in this example), the power down signal SlowPD0 changes to a low level, the tXPDLL as a delay amount of the delay circuit 202 passes, until when a CAS write latency-two clock cycles passes. Therefore, a logic level of the internal ODT signal IODT5 is fixed in the period B until when the internal ODT signal IODT5 is output.

As explained above, according to the second embodiment, because a CWL counter corresponding to the enable signal CKE is not necessary, the circuit scale can be further reduced and the power consumption can be also further reduced, in addition to obtaining an effect of the first embodiment.

Because a multiplexer is not necessary at a latter stage of the CWL counter 201, a decrease of a margin due to the presence of a multiplexer does not occur.

Further, because a delay amount of the delay circuit 202 is tXPDLL, the internal clock signal ICLK3 is not output until when tXPDLL passes after the power down signal SlowPD0 changes to a low level. Therefore, the time necessary to stabilize the DLL circuit 80 can be sufficiently secured.

In the second embodiment, although all register circuits constituting a shift register in the CWL counter 201 are set or reset based on the set signal SET or the reset signal RST, all register circuits are not necessarily required to be set or reset. It is sufficient to set or reset register circuits of a CAS write latency-two clock cycles including the register circuit at the initial stage. This is because circuits exceeding a CAS write latency-two clock cycles are not actually used.

The ODT control circuit 300 according to a third embodiment of the present invention is explained next.

Figure 7:
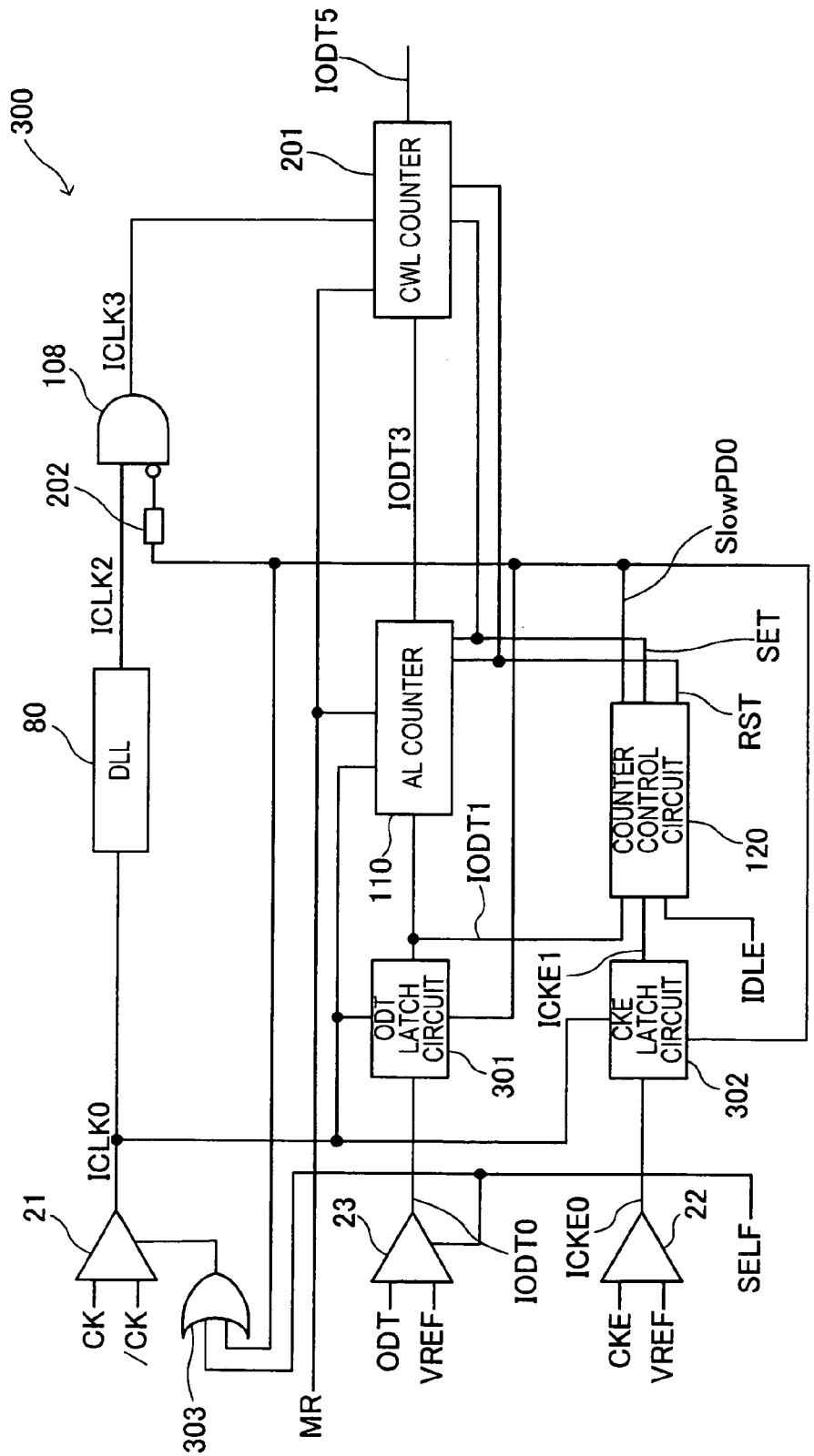
FIG. 7 is a circuit diagram of the ODT control circuit 300 according to the third embodiment.

FIG. 7 is a circuit diagram of the ODT control circuit 300 according to the third embodiment. The ODT control circuit 300 according to the third embodiment can be used instead of the ODT control circuit 100 shown in FIG. 2 or instead of the ODT control circuit 200 shown in FIG. 5.

As shown in FIG. 7, the ODT control circuit 300 includes an ODT latch circuit 301 and a CKE latch circuit 302 instead of the ODT latch circuit 101 and the CKE latch circuit 102 included in the ODT control circuit 200. Further, the ODT control circuit 300 includes an OR gate 303 instead of the AND gate 106. The ODT control circuit 300 is the same as the ODT control circuit 200 in other constituent elements. Therefore, like reference numerals are denoted to like constituent elements and redundant explanations thereof will be omitted.

Figure 9:
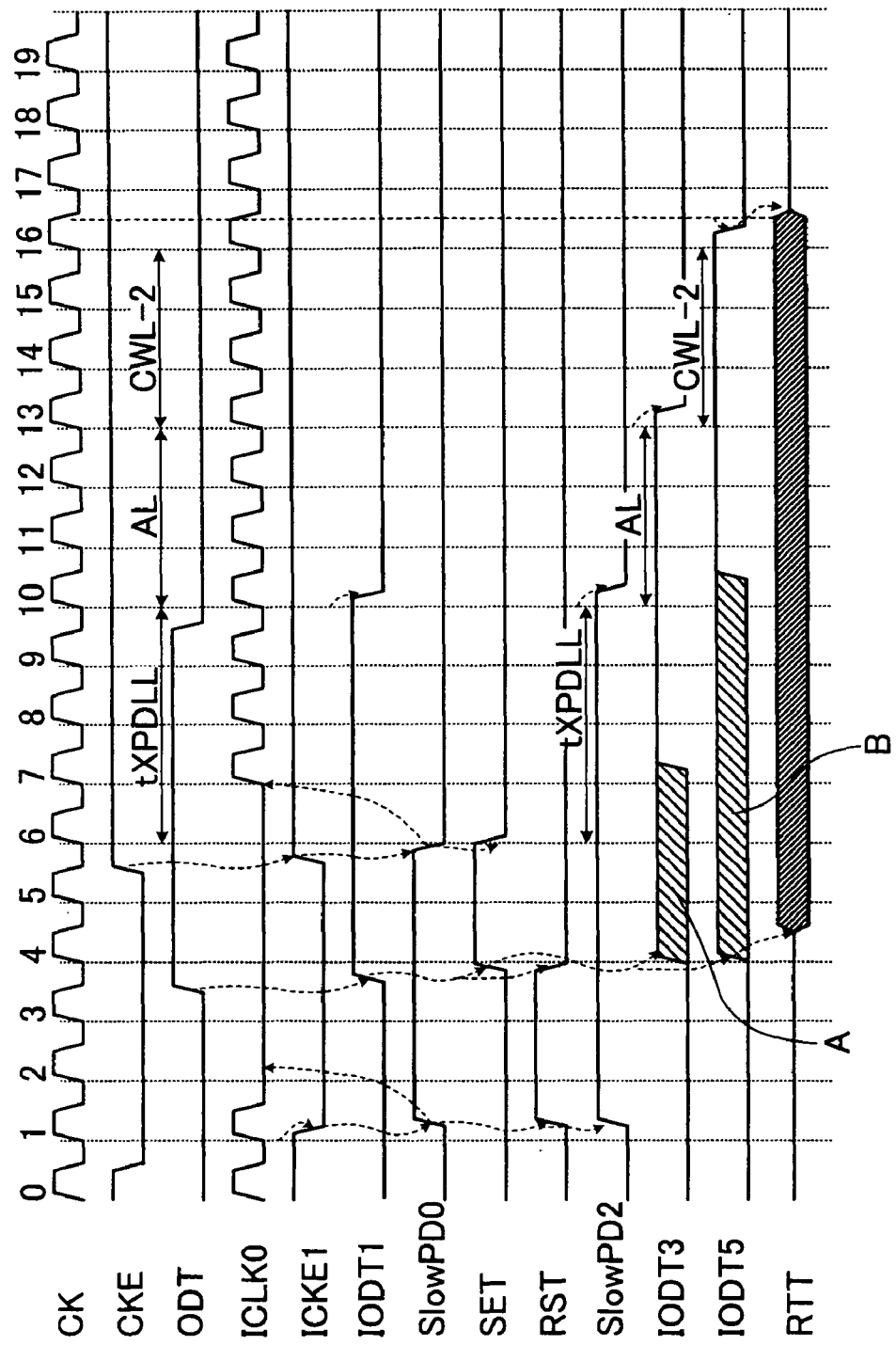
FIG. 9 is a timing diagram for explaining an operation of the ODT control circuit 300 according to the third embodiment.

The OR gate 303 is supplied with a self refresh signal SELF and the power down signal SlowPD0, and their output is supplied to the clock input circuit 21. Based on this configuration, an operation of the clock input circuit 21 stops and the internal clock signal ICLK0 is not generated as shown in FIG. 9 when the self refresh signal SELF is activated and also when the power down signal SlowPD0 is activated. Therefore, when entered in the power down mode, a latch operation by the ODT latch circuit 301 and the CKE latch circuit 302 cannot be performed. Accordingly, a bypass path is provided in the latch circuits 301 and 302.

Figure 8:
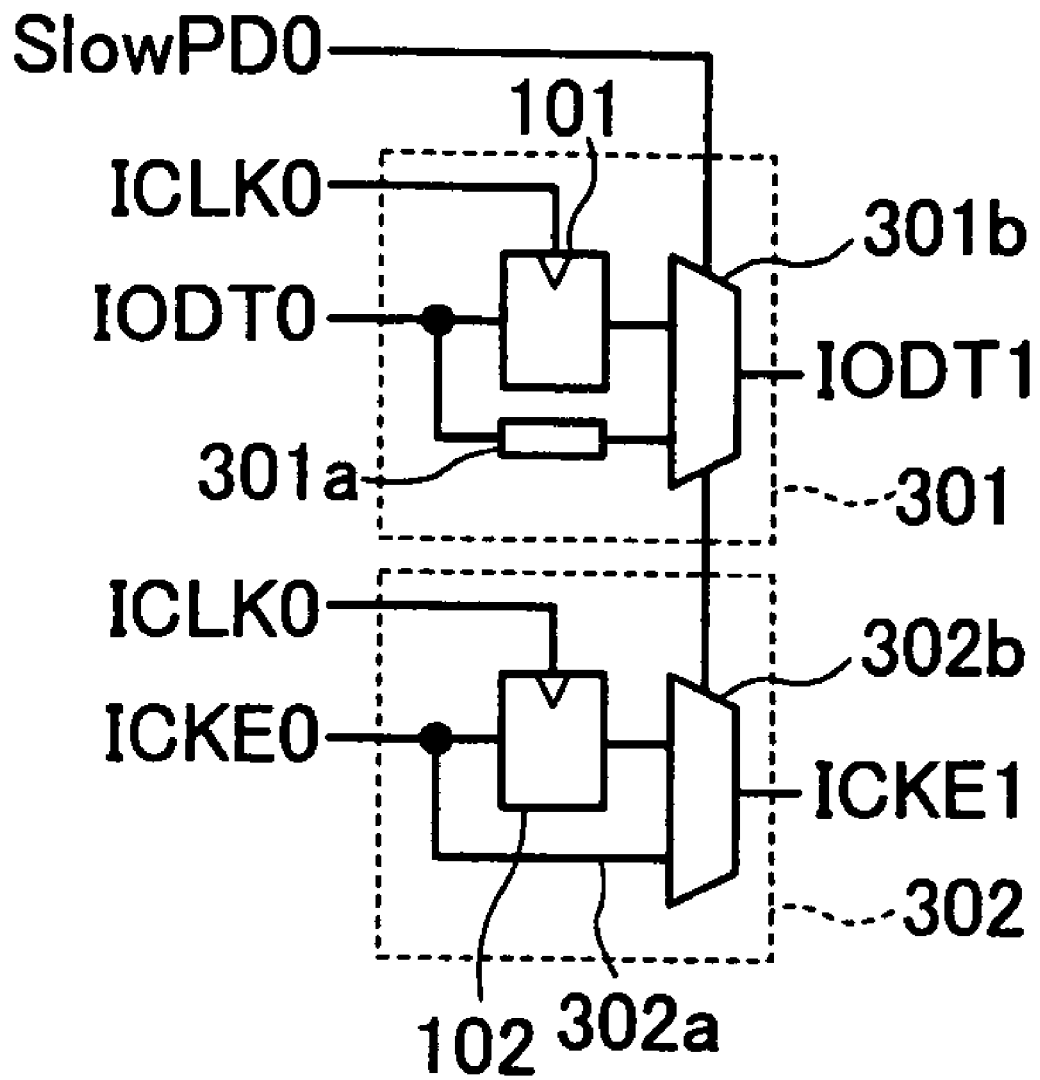
FIG. 8 is a circuit diagram of the ODT circuit 301 and the CKE latch circuit 302.

FIG. 8 is a circuit diagram of the ODT circuit 301 and the CKE latch circuit 302.

As shown in FIG. 8, the ODT latch circuit 301 includes the latch circuit 101, a delay circuit 301a, and a multiplexer 301b that selects one of outputs of these circuits. The multiplexer 301b is supplied with the power down signal SlowPD0 as a selection signal. A path at a latch circuit 101 side is selected when the power down signal SlowPD0 is at a low level (an inactive level), and a path at a delay circuit 301a side is selected when the power down signal SlowPD0 is at a high level (an active level).

Similarly, the CKE latch circuit 302 includes the latch circuit 102, a bypass wiring 302a, and a multiplexer 302b that selects any one of their outputs. The multiplexer 302b is supplied with the power down signal SlowPD0 as a selection signal. A path at a latch circuit 102 side is selected when the power down signal SlowPD0 is at a low level (an inactive level), and a path at a bypass wiring 302a side is selected when the power down signal SlowPD0 is at a high level (an active level).

With this configuration, in the normal mode, the latch circuits 301 and 302 perform a latch operation synchronous with the internal clock signal ICLK0. On the other hand, a latch operation is bypassed in the power down mode. Therefore, even when the internal clock signal ICLK0 stops, the internal ODT signal IODT1 and the internal-clock enable signal ICKE1 can be output. The delay circuit 301a is provided in the bypass path of the ODT latch circuit 301 to prevent an output timing of the internal ODT signal IODT1 from becoming earlier by a setup time of the external ODT signal ODT.

As explained above, according to the third embodiment, because the internal clock signal ICLK0 stops in the power down mode, the power consumption can be further decreased, in addition to obtaining an effect of the second embodiment.

Figure 10:
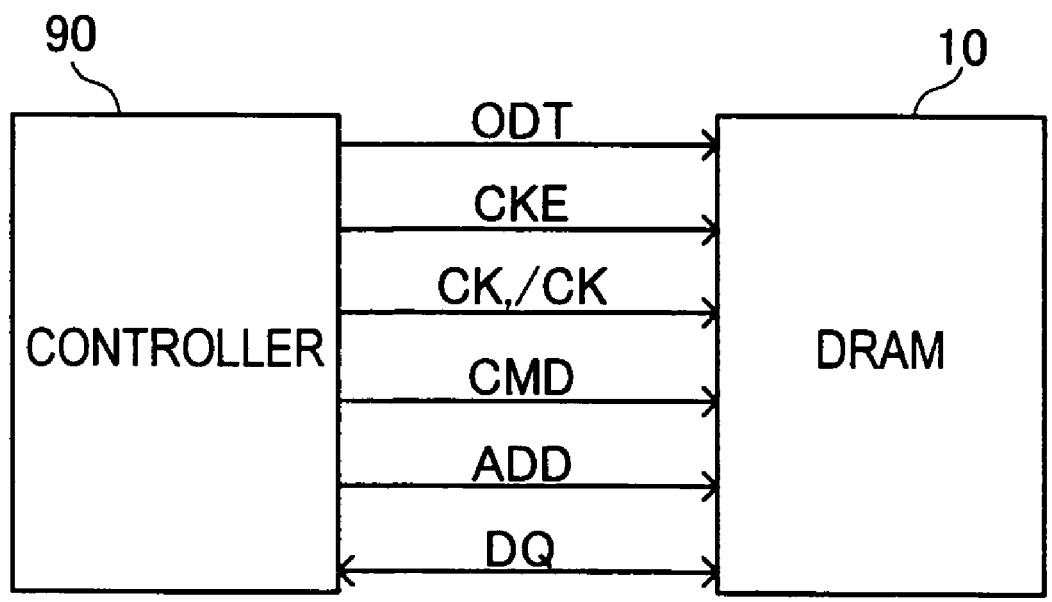
FIG. 10 is a block diagram of a data processing system using the SDRAM 10.

FIG. 10 is a block diagram of a data processing system using the SDRAM 10 according to the third embodiment.

The data processing system shown in FIG. 10 is configured by the SDRAM 10 and a controller 90 connected thereto. The controller 90 supplies the external clock signals CK and /CK, the external-clock enable signal CKE, the external ODT signal ODT, the command signal CMD, and the address signal ADD to the SDRAM 10, and exchanges data DQ with the SDRAM 10.

The controller 90 can cause the SDRAM 10 enter the power down mode or exit from the power down mode by using the external-clock enable signal CKE. As already explained above, the ODT operation shifts from the asynchronous mode to the synchronous mode to return from the power down mode (the slow power-down mode). This shifting can be performed in a state that the external ODT signal ODT is activated. In this case, the ODT operation does not stop, as described above.

It is apparent that the present invention is not limited to the above embodiments, but may be modified and changed without departing from the scope and spirit of the invention.

For example, while the above embodiments have described an instance where the present invention is applied to a DDR3 SDRAM, the application target of the present invention is not limited thereto.

Furthermore, in the above embodiments, although a shift register is used as a FIFO counter that counts an additive latency and a CAS write latency, the type of a FIFO counter is not limited thereto, and other types of a FIFO counter such as a point-shift FIFO counter can be also used.

In addition, while not specifically claimed in the claim section, the applicant reserves the right to include in the claim section of the application at any appropriate time the following device:

A1. A semiconductor device comprising:
an ODT input circuit that receives an external ODT signal from an ODT terminal and outputs a first internal ODT signal;
a latch circuit that latches the first internal ODT signal;
a first counter circuit that includes a plurality of register circuits connected in series with each other and outputs a second internal ODT signal when a predetermined cycle of a first clock signal is counted after receiving the first internal ODT signal; and
a counter control circuit that writes data held in the latch circuit at a time of an activation of a power-down-mode control signal into the register circuits.

A2. The semiconductor device as claimed in claim A1, wherein
the plurality of register circuits includes an initial stage register circuit,
each of the register circuits performs a latch operation synchronously with the first clock signal,
the first internal ODT signal is supplied to the initial stage register circuit, and
a multiplexer extracts an output of any one of the register circuits as the second internal ODT signal.

A3. The semiconductor device as claimed in claim A1, further comprising a second counter circuit that outputs a third internal ODT signal when a second predetermined cycle of a second clock signal is counted after receiving the second internal ODT signal.

A4. The semiconductor device as claimed in claim A3, further comprising a ODT circuit activated synchronously with the second clock signal during a synchronous mode and activated asynchronously with the second clock signal during an asynchronous mode.

A5. The semiconductor device as claimed in claim A4, wherein the first counter counts an additive latency as the first predetermined cycle, and the second counter counts a CAS write latency as the second predetermined cycle.

What is claimed is:

1. A semiconductor device, comprising:
a first FIFO counter that receives a first internal ODT signal and outputs a second internal ODT signal in response to counting a first clock signal by a first predetermined number after receiving the first internal ODT signal;
a counter control circuit that controls the FIFO counter such that the first FIFO counter outputs the second internal ODT signal having a same logic value as a logic value of the first internal ODT signal at a time of changing from an asynchronous mode to a synchronous mode during a period until when the first FIFO counter receives the first clock signal by at least the first predetermined number after the changing; and
a ODT circuit activated synchronously with a second clock signal generated based on the first clock signal during the synchronous mode and activated asynchronously with the second clock signal during the asynchronous mode,
wherein the FIFO counter includes:
a shift register in which a plurality of register circuits includes an initial stage register circuit are connected in cascade, each of the register circuits performing a latch operation synchronously with the first clock signal, and the first internal ODT signal being supplied to the initial stage register circuit of the shift register; and
a multiplexer that extracts an output of any one of the register circuits as the second internal ODT signal, and
wherein the counter control circuit sets or resets at least all the register circuits from the initial stage register circuit to a register circuit at a same number of stages as the first predetermined number, based on a logic value of the first internal ODT signal at the time of changing.

2. The semiconductor device as claimed in claim 1, wherein the counter control circuit sets or resets all register circuits that constitute the shift register, based on a logic value of the first internal ODT signal at the time of changing.

3. A semiconductor device comprising:
an internal terminal supplied with ODT information;
a register circuit including a plurality of latch circuits which are connected such that an output node of a preceding one of the latch circuits is connected to an input node of a succeeding one of the latch circuits, and a leading one of the latch circuits being coupled to the internal terminal to receive the ODT information at an input node thereof;
a multiplexer coupled to at least two of the output nodes of the latch circuits, and being configured to select information of one of the at least two of the output nodes of the latch circuits in response to mode register information and output a selected information of the one of the at least two of the output nodes of the latch circuits as internal ODT information;
a data output circuit functioning as a terminating resistor in response to the internal ODT information; and
a control circuit coupled to the internal terminal and the latch circuits of the register circuit, and being configured to control each of the latch circuits to store a logic value during a power down mode, the logic value being determined based on a logic value of the ODT information appearing at the internal terminal during the power down mode.

4. The semiconductor device as claimed in claim 3, wherein the control circuit is configured to control the latch circuits of the register circuit to operate as a shift register during a normal operation mode.

5. The semiconductor device as claimed in claim 4, wherein the register circuit is provided to count an additive latency, and the mode register information corresponds to an additive latency information, the semiconductor device further comprising:

an additional register circuit provided between the data output circuit and the multiplexer, receiving the internal ODT information, and being activated to output the internal ODT information after an expiration of a period determined by a CAS write latency information in the normal operation mode and being inactivated in the power down mode.

6. The semiconductor device as claimed in claim 5, further comprising:

an additional multiplexer of which an output node is coupled to the data output circuit, the additional multiplexer including a first input node supplied with the internal ODT information that is outputted from the additional register circuit and a second input node supplied with the internal ODT information directly outputted from the multiplexer, the additional multiplexer outputting the internal ODT information of the first input node to the output node thereof in the normal operation mode, and outputting the internal ODT information of the second input node to the output node thereof in the power down mode.

7. The semiconductor device as claimed in claim 4, wherein each of the latch circuits of the register circuit is supplied with a first clock signal to transfer the ODT information from the preceding one of the latch circuits to the succeeding one of the latch circuits in synchronism with the first clock signal, the first clock signal being activated in both the normal operation mode and the power down mode.

8. The semiconductor device as claimed in claim 5, wherein each of the latch circuits of the register circuit is supplied with a first clock signal to transfer the ODT information from the preceding one of the latch circuits to the succeeding one of the latch circuits in synchronism with the first clock signal, the first clock signal clocking in both the normal operation mode and the power down mode, the additional register circuit being supplied with a second clock signal to output the internal ODT information, and the second clock signal clocking in the normal operation mode and not clocking in the power down mode.

* * * * *